(12) United States Patent
Kim

(10) Patent No.: US 9,039,216 B2
(45) Date of Patent: May 26, 2015

(54) LIGHT EMITTING DEVICE PACKAGE AND LIGHT UNIT HAVING THE SAME

(75) Inventor: Wan Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 121 days.

(21) Appl. No.: 13/075,354

(22) Filed: Mar. 30, 2011

(65) Prior Publication Data

US 2011/0211334 A1   Sep. 1, 2011

(30) Foreign Application Priority Data

Apr. 1, 2010 (KR) .................. 10-2010-0030019
Apr. 1, 2010 (KR) .................. 10-2010-0030020

(51) Int. Cl.
| | |
|---|---|
| *F21V 9/16* | (2006.01) |
| *H01L 33/54* | (2010.01) |
| *H01L 33/48* | (2010.01) |
| *H01L 33/62* | (2010.01) |
| *G02F 1/1335* | (2006.01) |
| *H01L 33/50* | (2010.01) |
| *H01L 33/64* | (2010.01) |

(52) U.S. Cl.
CPC ............ *H01L 33/54* (2013.01); *H01L 33/486* (2013.01); *H01L 33/62* (2013.01); *H01L 2224/48227* (2013.01); *G02F 1/133603* (2013.01); *H01L 33/505* (2013.01); *H01L 33/507* (2013.01); *H01L 33/64* (2013.01)

(58) Field of Classification Search
CPC .......... H01L 2224/48091; H01L 2924/00014; H01L 33/486; H01L 2224/48227; G02F 1/133603

USPC ............................................ 362/84, 230–235
See application file for complete search history.

(56) References Cited

U.S. PATENT DOCUMENTS

| | | | |
|---|---|---|---|
| 7,728,438 B2 | 6/2010 | Kameyama et al. | |
| 7,808,013 B2 | 10/2010 | Mendendorp, Jr. et al. | |
| 7,839,087 B2 * | 11/2010 | Takasu et al. | 313/512 |
| 8,232,578 B2 * | 7/2012 | Takeda et al. | 257/100 |
| 2006/0186431 A1 | 8/2006 | Miki et al. | |
| 2007/0058357 A1 | 3/2007 | Yamaguchi et al. | |
| 2007/0228390 A1 * | 10/2007 | Hattori et al. | 257/79 |
| 2008/0068845 A1 * | 3/2008 | Aida et al. | 362/311 |
| 2008/0258168 A1 | 10/2008 | Loh et al. | |
| 2009/0021140 A1 | 1/2009 | Takasu et al. | |
| 2009/0179213 A1 | 7/2009 | Cannon et al. | |
| 2009/0180273 A1 * | 7/2009 | Kim et al. | 362/84 |
| 2009/0190325 A1 | 7/2009 | Wang et al. | |
| 2009/0213296 A1 | 8/2009 | Park et al. | |
| 2010/0020541 A1 * | 1/2010 | Incorvia et al. | 362/249.01 |
| 2010/0052006 A1 | 3/2010 | Takeda et al. | |

(Continued)

FOREIGN PATENT DOCUMENTS

| | | |
|---|---|---|
| CN | 1574403 A | 2/2005 |
| CN | 1822365 A | 8/2006 |
| CN | 101308898 A | 11/2008 |

(Continued)

*Primary Examiner* — Anh Mai
*Assistant Examiner* — Jessica M Apenteng
(74) *Attorney, Agent, or Firm* — Birch, Stewart, Kolasch & Birch, LLP

(57) ABSTRACT

Disclosed are a light emitting device package and a light unit having the same. The light emitting device package includes a ceramic substrate; a light emitting device on the ceramic substrate; a first light-transmissive resin layer on the ceramic substrate to cover the light emitting device; and a phosphor layer on the first light-transmissive resin layer.

20 Claims, 12 Drawing Sheets

(56) References Cited

U.S. PATENT DOCUMENTS

| | | | |
|---|---|---|---|
| 2010/0090231 A1* | 4/2010 | Jung et al. | 257/89 |
| 2010/0321920 A1* | 12/2010 | Wu et al. | 362/84 |

FOREIGN PATENT DOCUMENTS

| | | |
|---|---|---|
| CN | 101606247 A | 12/2009 |
| EP | 1 657 756 A2 | 5/2006 |
| EP | 1 860 373 A1 | 11/2007 |
| JP | 2006-49624 A | 2/2006 |
| JP | 2006-216753 A | 8/2006 |
| JP | 2008-27999 A | 2/2008 |
| KR | 10-2010-0003335 A | 1/2010 |

* cited by examiner

LIGHT EMITTING DEVICE PACKAGE AND LIGHT UNIT HAVING THE SAME

The present application claims priorities of Korean Patent Application Nos. 10-2010-0030019 and 10-2010-0030020 filed on Apr. 1, 2010, which are hereby incorporated by reference in their entirety.

BACKGROUND

The embodiment relates to a light emitting device package and a light unit having the same.

A light emitting diode (LED) may constitute a light source for generating light by using GaAs, AlGaAs, GaN, InGaN, and InGaAlP-based compound semiconductor materials.

Such an LED is packaged so as to be used as a light emitting device that emits lights having various colors. The light emitting device is used as a light source in various products such as a lighting indicator, a character indicator, and an image display.

SUMMARY

The embodiment provides a light emitting device package having a novel structure.

The embodiment provides a light emitting device package including a ceramic substrate, a light emitting device on the ceramic substrate, a light-transmissive resin layer on the light emitting device, and a phosphor layer on the light-transmissive resin layer.

The embodiment provides a light emitting device package including a phosphor layer disposed between light-transmissive resin layers.

The embodiment provides a light emitting device package capable of preventing moisture from penetrating into the light emitting device package through an interfacial surface between a planar type substrate and a resin layer.

The embodiment provides a light emitting device package including a moisture barrier layer provided at an outer portion of the substrate.

The embodiment can improve the reliability of a lighting system, such as a display device, an indicator or a lighting device having the light emitting device package.

A light emitting device package according to the embodiment includes a ceramic substrate; a light emitting device on the ceramic substrate; a first light-transmissive resin layer on the ceramic substrate to cover the light emitting device; and a phosphor layer on the first light-transmissive resin layer, wherein the first light-transmissive resin layer has a same width that of the ceramic substrate.

A light emitting device package according to the embodiment includes a substrate; a light emitting device on the substrate; a resin layer on the substrate; and a moisture barrier layer on the substrate and an outer portion of the resin layer.

A light unit according to the embodiment includes a light emitting device package including a planar type ceramic substrate, a light emitting device on the ceramic substrate, a first light-transmissive resin layer on the ceramic substrate to seal the light emitting device, and a phosphor layer on the first light-transmissive resin layer; a module substrate on which the light emitting device package is arrayed; and a light guide plate or an optical sheet at one side of the light emitting device package.

DETAILED DESCRIPTION OF THE EMBODIMENTS

Figure 1:
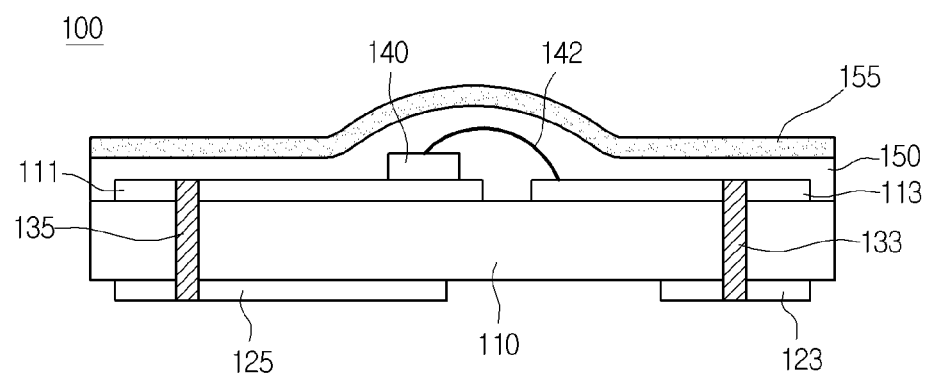
FIG. 1 is a side sectional view showing a light emitting device package according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, exemplary embodiments will be described with reference to accompanying drawings. FIG. 1 is a side sectional view showing a light emitting device package according to the first embodiment, FIG. 2 is a perspective view showing a top surface pattern of a ceramic substrate shown in FIG. 1, and FIG. 3 is a bottom view showing a lower surface pattern of the ceramic substrate shown in FIG. 1.

Figure 2:
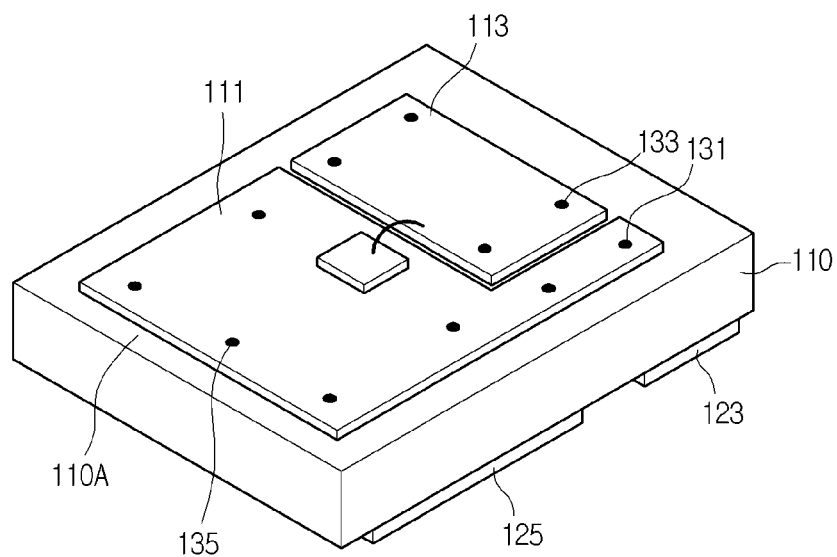
FIG. 2 is a perspective view showing a top surface pattern of a ceramic substrate shown in FIG. 1.
Figure 3:
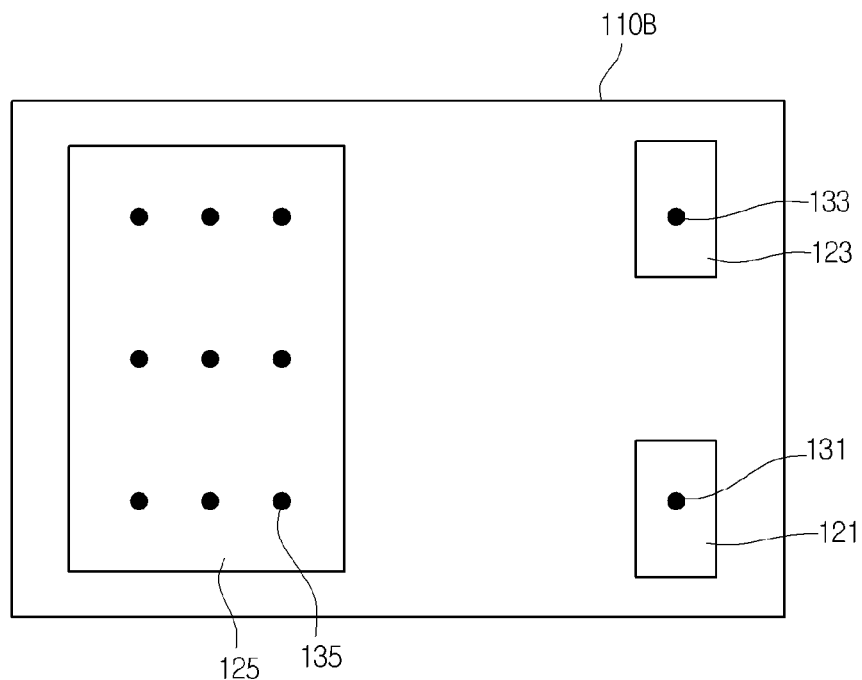
FIG. 3 is a bottom view showing a lower surface pattern of a ceramic substrate shown in FIG. 1.

Referring to FIGS. 1 to 3, the light emitting device package 100 includes a substrate 110, first and second electrode patterns 111 and 113, third and fourth electrode patterns 121 and 123, a heat radiation pattern 125, conductive vias 131, 133 and 135, a light emitting device 140, a first light-transmissive resin layer 150 and a phosphor layer 155.

The substrate 110 has a superior heat-resistant property and a superior tarnish-resistant property against heat. The substrate 110 may include alumina, quartz, calcium zirconate, forsterite, SiC, graphite, fused silica, mullite, cordierite, zirconia, beryllia, aluminum nitride, or LTCC (low temperature co-fired ceramic). For the purpose of convenience of explanation, the ceramic substrate will be described below as an example of the substrate 110.

The ceramic substrate 110 may be prepared as a single-layer substrate or a multiple-layer substrate by using the structure of a single-side copper foil layer or a dual-side copper foil layer. The copper foil layer may be prepared as a metal plate by selectively using a conductive metal, such as Cu, Ag, Al, Ni, or Au and may have a predetermined pattern formed through an etching process. The ceramic substrate 110 may have a circular shape or a polygonal shape, but the embodiment is not limited thereto.

Referring to FIGS. 2 and 3, the first and second electrode patterns 111 and 113 are formed on a top surface 110A of the ceramic substrate 110, and the third and fourth electrode patterns 121 and 123 and the heat radiation pattern 125 are formed on a lower surface 110B of the ceramic substrate 110. The first electrode pattern 111 is connected to the third electrode pattern 121 through at least one conductive via 131 such that a part of the first electrode pattern 111 may correspond to a part of the third electrode pattern 121. In addition, the second electrode pattern 113 is connected to the fourth electrode pattern 123 through at least one conductive via 133 such that a part of the second electrode pattern 113 may correspond to a part of the fourth electrode pattern 123.

A size of the first electrode pattern 111 may be larger than a size of the second electrode pattern 113 and the first electrode pattern 111 may branch in various directions to dissipate heat generated from the light emitting device 140.

The heat radiation pattern 125 may be formed on the lower surface 110B of the ceramic substrate 110 corresponding to the first electrode pattern 111. The first electrode pattern 111 is connected to the heat radiation pattern 125 through at least one third conductive via 135 such that a part of the first electrode pattern 111 may correspond to a part of the heat radiation pattern 125. The heat radiation pattern 125 may have a size larger than that of the third and fourth electrode patterns 121 and 123.

The light emitting device 140 is formed on the first electrode pattern 111. In detail, the light emitting device 140 is mounted on the first electrode pattern 111 by using a conductive adhesive or a solder.

The second electrode pattern 113 is spaced apart from the first electrode pattern 111 and connected to the light emitting device 140 through a wire 142.

The first and second electrode patterns 111 and 113 are positioned corresponding to the center region of the ceramic substrate 110 and electrically connected to the light emitting device 140.

The light emitting device 140 can be connected to the first and second electrode patterns 111 and 113 through a die bonding scheme, a flip chip bonding scheme or a wire bonding scheme according to the position of an electrode of a chip or a type of the chip, but the embodiment is not limited thereto.

As shown in FIGS. 1 to 3, the first to third conductive vias 131, 133 and 135 are formed through the ceramic substrate 110 such that the patterns formed on the ceramic substrate 110 can be connected to the patterns formed under the ceramic substrate 110. The first to third conductive vias 131, 133 and 135 of the ceramic substrate 110 can be formed by filling via holes or through holes with conductive materials, such as Ag, or coating the conductive materials around the via holes or through holes. The third electrode pattern 121 can be integrally formed with the heat radiation pattern 125. Such a configuration of the patterns may vary depending on the heat radiation efficiency. The conductive vias 131, 133 and 135 are a conductive connective member.

The light emitting device 140 is an LED (light emitting diode) chip including a color LED chip, such as blue LED chip, a green LED chip, or a red LED chip, or a UV LED chip. At least one light emitting device 140 may be disposed on the ceramic substrate 110.

Referring to FIG. 1, a resin layer having a refractive index lower than that of a semiconductor medium of the light emitting device 140 may be formed on the ceramic substrate 110. The resin layer is an encapsulant layer to cover the light emitting device 140 and may include a phosphor material. For instance, the resin layer may include the first light-transmissive resin layer 150 and the phosphor layer 155.

The first light-transmissive resin layer 150 is formed on the ceramic substrate 110, and the phosphor layer 155 is formed on the first light-transmissive resin layer 150. The first light-transmissive resin layer 150 and the phosphor layer 155 may include a resin material, such as silicon, epoxy, or hybrid resin, but the embodiment is not limited thereto.

The first light-transmissive resin layer 150 encapsulants the light emitting device 140 and the first and second electrode patterns 111 and 113. The first light-transmissive resin layer 150 may have a predetermined thickness larger than a thickness of the light emitting device 140. The first light-transmissive resin layer 150 may be uniformly formed on the ceramic substrate 110 or may be unevenly formed on the ceramic substrate 110 according to the configuration of the structure.

The phosphor layer 155 may be formed on the first light-transmissive resin layer 150 through a molding process or a coating process. The phosphor layer 155 may include at least one type of phosphor materials, but the embodiment is not limited thereto. The phosphor layer 155 can be formed over the whole area of the first light-transmissive resin layer 150 with a predetermined thickness.

The phosphor material of the phosphor layer 155 excites the light emitted from the light emitting device 140 so that the light has a long wavelength. For instance, the phosphor layer 155 may selectively include a green phosphor material, a red phosphor material or a red phosphor material. In addition, the phosphor material may allow the light to have a complementary color with respect to the color spectrum of the light emitting device 140.

Since the first light-transmissive resin layer 150 is disposed between the phosphor layer 155 and the light emitting device 140, the light emitted from the light emitting device 140 is diffused by the first light-transmissive resin layer 150 and a part of the diffused light may be absorbed in the phosphor layer 155 and then emitted to the outside. Thus, the light emitted through the phosphor layer 155 may have a uniform color distribution.

The phosphor layer 155 may have a same width that of the first light-transmissive resin layer 150 and have a thickness thinner than that of the first light-transmissive resin layer 150. The first light-transmissive resin layer 150 has a same width that of at least one of a lower surface and a top surface of the ceramic substrate 110.

Since the light emitting device 140 is disposed on the planar type ceramic substrate 110, the light emitting device 140 may emit the light with an orientation angle of about 120° or above. In addition, since the phosphor layer 155 is formed over the whole area of the ceramic substrate 110, the light emitting device package 100 can emit the light at the above orientation angle with the uniform color distribution.

Figure 4:
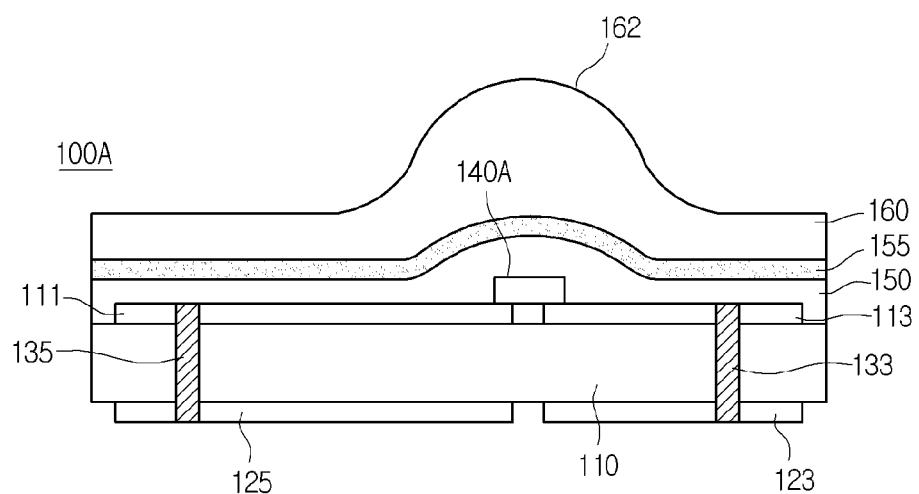
FIG. 4 is a side sectional view showing a light emitting device package according to the second embodiment.
Figure 5:
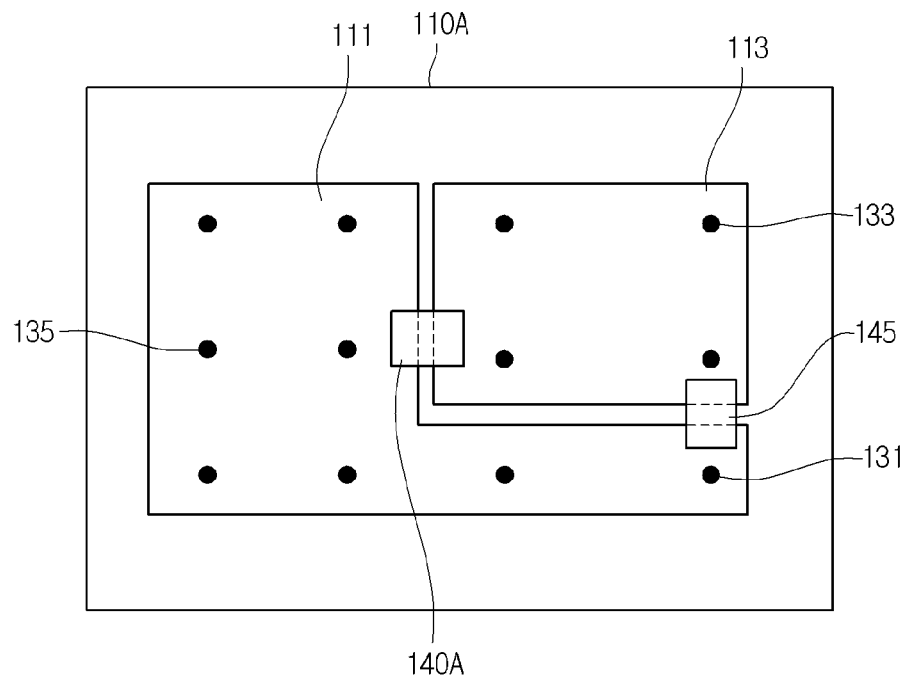
FIG. 5 is a plan view showing a top surface pattern of a ceramic substrate shown in FIG. 4.

FIG. 4 is a side sectional view showing a light emitting device package according to the second embodiment, and FIG. 5 is a plan view showing the light emitting device and a protective pattern formed on a pattern of a ceramic substrate shown in FIG. 4. The following description of the second embodiment will be made with reference to the first embodiment.

Referring to FIGS. 4 and 5, the light emitting device package 100A includes a light emitting device 140A, a first light-transmissive resin layer 150, a phosphor layer 155 and a second light-transmissive resin layer 160.

The light emitting device 140A can be mounted on the first and second electrode patterns 111 and 113, which correspond to each other, through a flip chip scheme by using a conductive bump.

The second light-transmissive resin layer 160 is formed on the phosphor layer 155. The second light-transmissive resin layer 160 covers the whole top surface of the phosphor layer 155 and is injection-molded by using a same material that of the first light-transmissive resin layer 150.

The second light-transmissive resin layer 160 includes a lens unit 162. The center of the lens unit 162 corresponds to an optical axis perpendicular to the light emitting device 140A. The lens unit 162 has a hemispherical shape protruding upward from the light emitting device 140A. A maximum diameter of the lens unit 162 is 120 μm or above. The lens unit 162 may be formed of a convex lens.

Referring to FIG. 5, end portions of the first and second electrode patterns 111 and 113 are disposed at an outer peripheral region of the ceramic substrate 110. A protective device, such as a Zener diode or a TVS (transient voltage suppression) diode, is electrically connected to the first and second electrode patterns 111 and 113. For instance, the protective device can be mounted through a flip chip scheme. When comparing the position of the protective device with that of the light emitting device 140A, the protective device is closer to the outer peripheral portion of the ceramic substrate 110, so that the light loss of the light emitting device 140A can be reduced. The protective device 145 can be connected through at least one wire, and the embodiment is not limited thereto.

The lens unit 162 of the second light-transmissive resin layer 160 is disposed on the light emitting device 140A. Other regions of the second light-transmissive resin layer 160 except for the lens unit 162 are flat, so the second light-transmissive resin layer 160 can be formed on the phosphor layer 155 with a uniform thickness.

Figure 6:
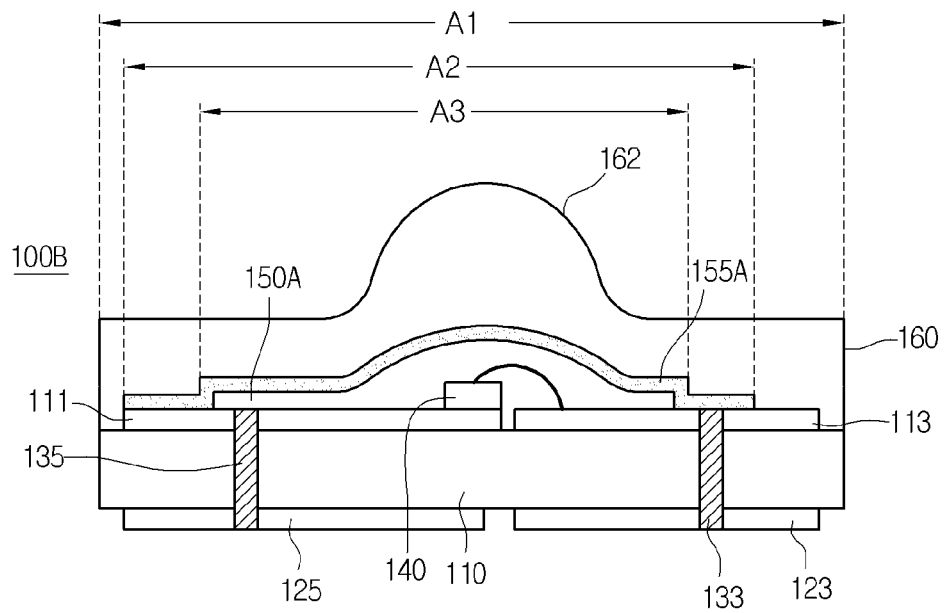
FIG. 6 is a side sectional view showing a light emitting device package according to the third embodiment.

FIG. 6 is a side sectional view showing a light emitting device package according to the third embodiment. The following description of the third embodiment will be made with reference to the first embodiment.

Referring to FIG. 6, the light emitting device package 100B includes a first light-transmissive resin layer 150A having a third width A3, a phosphor layer 155A having a second width A2 and a second light-transmissive resin layer 160A having a first width A1, which are formed on a top surface of the ceramic substrate 110. The first to third widths satisfy A1<A2<A3. The first to third widths A1, A2 and A3 are defined on the basis of one lateral side of the ceramic substrate 110.

Thus, the phosphor layer 155A surrounds the top surface and the outer lateral sides of the first light-transmissive resin layer 150A, and the second light-transmissive resin layer 160A surrounds the top surface and the outer lateral sides of the phosphor layer 155A. The first light-transmissive resin layer 150A, the phosphor layer 155A and the second light-transmissive resin layer 160A are bonded to the top surface of the ceramic substrate 110, respectively, so that the moisture can be prevented from penetrating into the light emitting device package 100B through the interfacial surface between the ceramic substrate 110 and the above layers.

Figure 7:
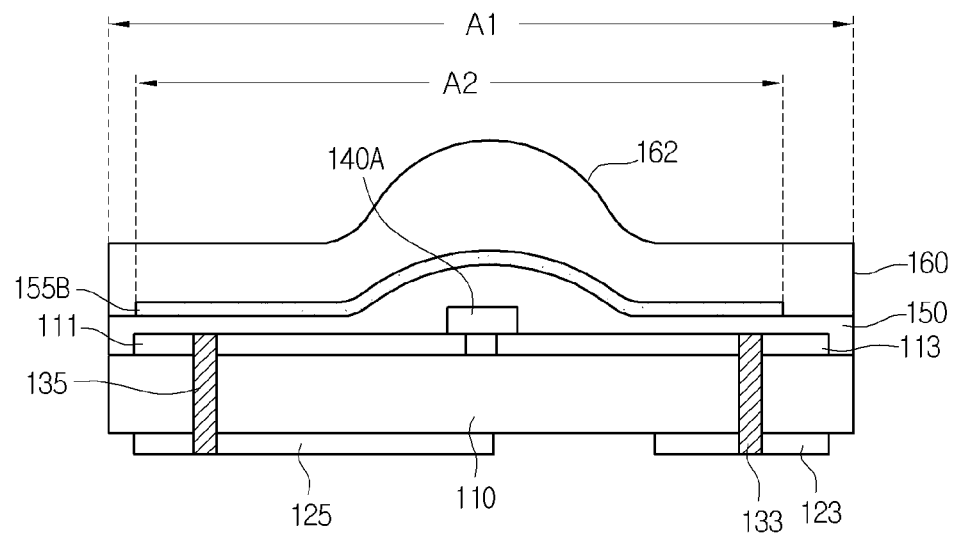
FIG. 7 is a side sectional view showing a light emitting device package according to the fourth embodiment.

FIG. 7 is a side sectional view showing a light emitting device package according to the fourth embodiment. The following description of the fourth embodiment will be made with reference to the first embodiment.

Referring to FIG. 7, the light emitting device package 100C includes a first light-transmissive resin layer 150 on an entire top surface of the ceramic substrate 110, a phosphor layer 155B on the first light-transmissive resin layer 150, and a second light-transmissive resin layer 160 on the phosphor layer 155B.

A width A2 of the phosphor layer 155B is less than a width A1 of the first light-transmissive resin layer 150 and a width of the second light-transmissive resin layer 160 is equal to the width A1 of the first light-transmissive resin layer 150. Accordingly, the second light-transmissive resin layer 160 makes contact with an outer portion of the top surface of the first light-transmissive resin layer 150, so that the phosphor layer 155B is sealed between the first light-transmissive resin layer 150 and the second light-transmissive resin layer 160. The widths A1 and A2 are a length or width defined on the basis of one lateral side of the ceramic substrate.

Figure 8:
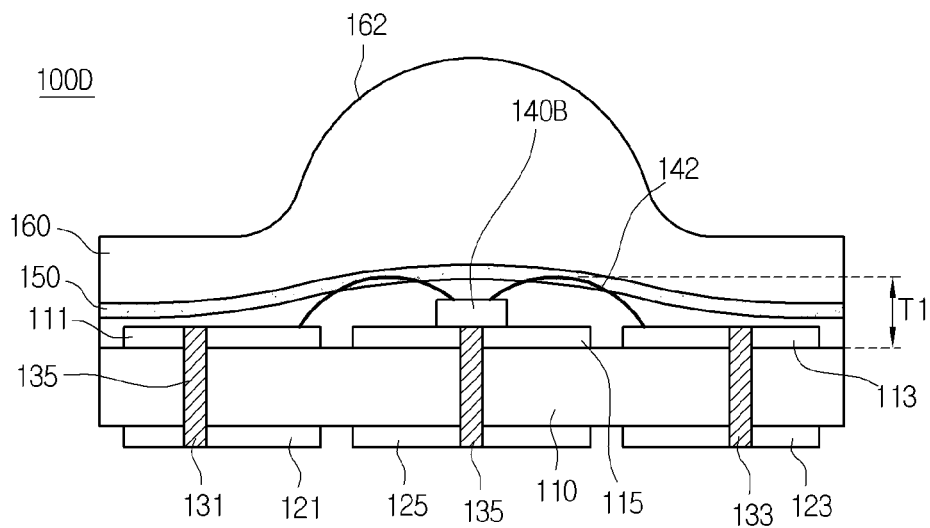
FIG. 8 is a side sectional view showing a light emitting device package according to the fifth embodiment.
Figure 9:
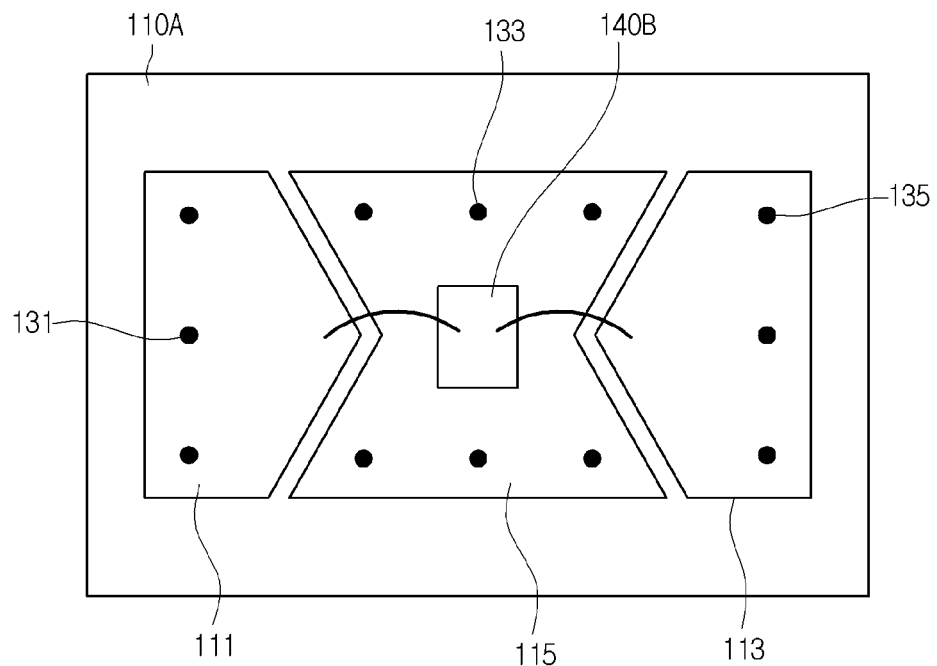
FIG. 9 is a plan view showing a top surface pattern of a ceramic substrate shown in FIG. 8.
Figure 10:
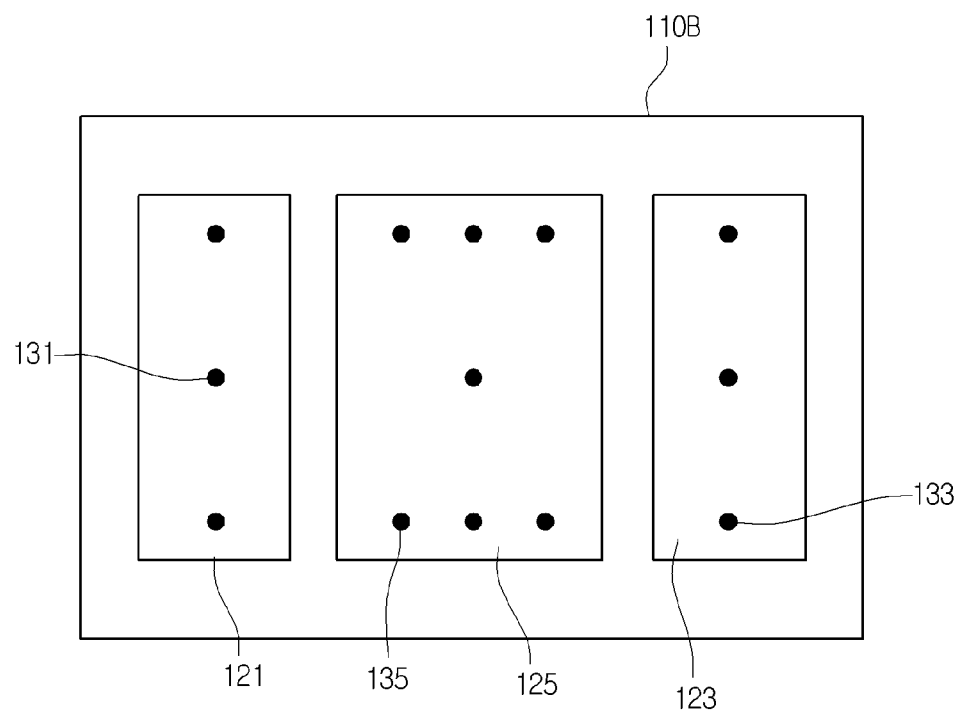
FIG. 10 is a bottom view showing a lower surface pattern of a ceramic substrate shown in FIG. 8.

FIG. 8 is a side sectional view showing a light emitting device package according to the fifth embodiment, FIG. 9 is a plan view showing a pattern formed on a top surface of a ceramic substrate shown in FIG. 8, and FIG. 10 is a bottom view showing a pattern formed on a lower surface of the ceramic substrate shown in FIG. 8. The following description of the fifth embodiment will be made with reference to the first embodiment.

Referring to FIGS. 8 to 10, a first electrode pattern 111, a second electrode pattern 113 and a first heat radiation pattern 115 are formed on the top surface of the ceramic substrate 110, and a third electrode pattern 121, a fourth electrode pattern 123 and a second heat radiation pattern 125 are formed on the lower surface of the ceramic substrate 110. A plurality of conductive vias 131, 133 and 135 are formed in the ceramic substrate 110.

The first heat radiation pattern 115 is disposed between the first electrode pattern 111 and the second electrode pattern 113, and the second heat radiation pattern 125 is disposed between the third electrode pattern 121 and the fourth electrode pattern 123.

The light emitting device 140B is attached onto the first heat radiation pattern 115 and the light emitting device 140 is connected to the first and second electrode patterns 111 and 114 through a wire 142.

The first electrode pattern 111 is opposite to the third electrode pattern 121 and connected to the third electrode pattern 121 through the first conductive via 131. The second electrode pattern 113 is opposite to the fourth electrode pattern 123 and connected to the fourth electrode pattern 123 through the second conductive via 133. The first heat radiation pattern 115 is connected to the second heat radiation pattern 125 through the third conductive via 135. A plurality of first to third conductive vias 131, 133 and 135 are provided to improve the conductive efficiency, but the embodiment is not limited thereto.

Heat generated from the light emitting device 140 is transferred to the first and second heat radiation patterns 115 and 125 through the third conductive via 135 and then dissipated to the outside.

The first light-transmissive resin layer 150, the phosphor layer 155 and the second light-transmissive resin layer 160 are formed on the ceramic substrate 110.

The height of the phosphor layer 155 may be equal to or higher than the highest point of the wire 142 connected to the light emitting device 140B based on the height T1 of the wire 142. If the wire 142 has the height T1, the wire 142 may not make contact with the second light-transmissive resin layer 160, so that the particles of the phosphor material can be prevented from moving to the second light-transmissive resin layer 160 through the wire 142.

Figure 11:
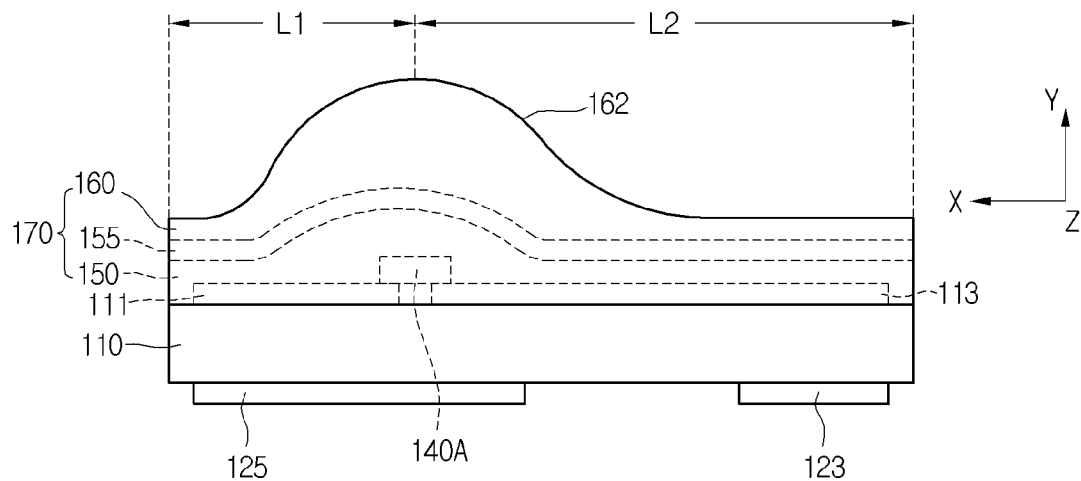
FIGS. 11 and 12 are side views showing an external appearance of a package according to the embodiment.
Figure 12:
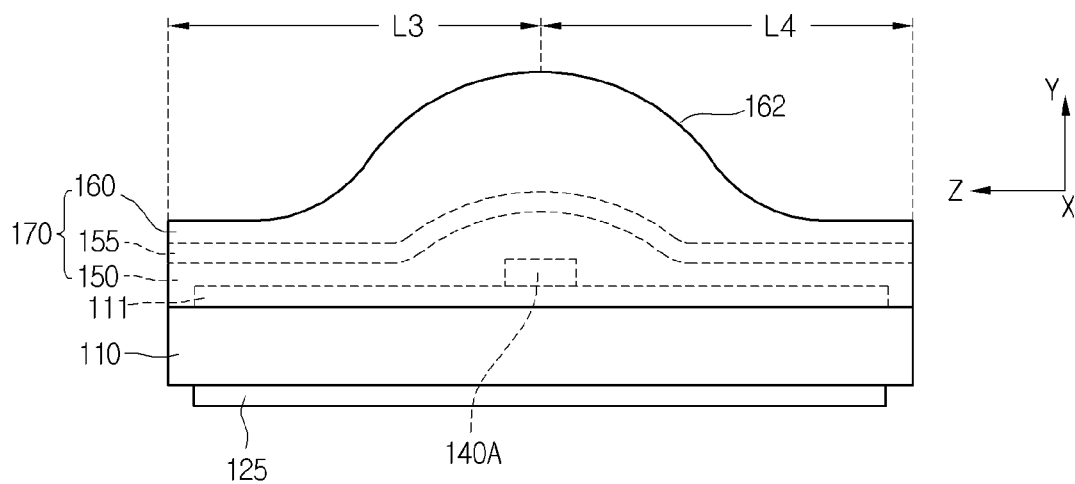

FIGS. 11 and 12 are side views showing an external appearance of a package according to the embodiment. FIG. 11 is a side view obtained from the first direction Z of the package and FIG. 12 is a side view obtained from the second direction X of the package, which is rotated by the right angle from the first direction X.

Referring to FIG. 11, when viewed in the first direction Z of the light emitting device package 101, the light emitting device 140A is biased to one side in the extension line of the second direction X (L1<L2). For instance, the light emitting device package 101 is located at the left region of the ceramic substrate 110, so other patterns or a protective device can be additionally formed at the right region of the ceramic substrate 110.

Thus, the lens unit 162 of the resin layer 170 formed on the light emitting device 140A is disposed at one region in the first direction Z, so the light may be mainly distributed over the one region. The resin layer 170 can be formed by sequentially stacking the first light-transmissive resin layer 150, the phosphor layer 155 and the second light-transmissive resin layer 160.

FIG. 12 shows the package, which is rotated by the right angle from FIG. 11, in the second direction X perpendicular to the first direction Z. When viewed in the second direction X, the light emitting device 140A is located at the center of the extension line in the first direction Z. Thus, the lens unit 162 of the resin layer 170 is located at the center of the package.

Although the width of the ceramic substrate 110 in the first direction Z is the same width that of the ceramic substrate 110 in the second direction X in FIGS. 11 and 12, the width of the ceramic substrate 110 in the first direction Z may be different from the width of the ceramic substrate 110 in the second direction X, and the embodiment is not limited thereto.

Figure 13:
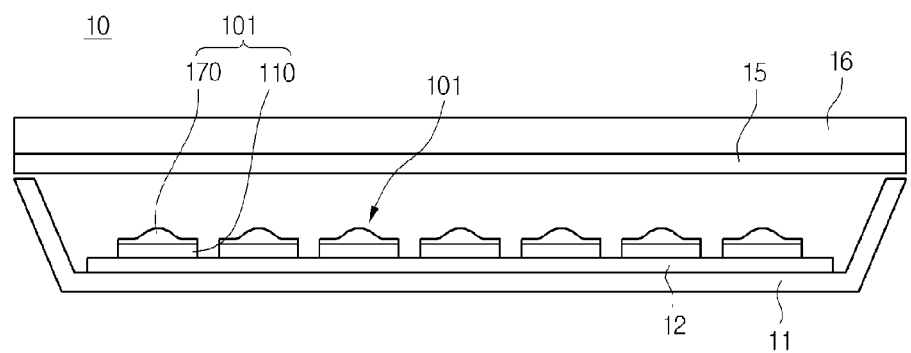
FIG. 13 is a side sectional view showing a display device according to the sixth embodiment.

FIG. 13 is a view showing a display device according to the sixth embodiment. The package shown in FIG. 13 is same with the package shown in FIGS. 11 and 12.

Referring to FIG. 13, the display device 10 includes a bottom cover 11, a module substrate 12 on which a plurality of light emitting device packages 101 are arrayed, an optical member 15 and a display panel 16.

The module substrate 12 and the light emitting device packages 101 may constitute a light emitting module and the bottom cover 11, at least one light emitting module and the optical member 15 may constitute a light unit.

The light emitting device packages 101 are arrayed on the module substrate 12 such that lens units of the resin layers 170 are spaced apart from each other at a regular interval, so that the light can be emitted over the whole area with a uniform brightness distribution. That is, the light emitting device packages 101 as shown in FIG. 12 are arrayed on the module substrate 12.

The bottom cover 11 includes a same material with a material of a chassis or a mold frame, and the module substrate 12 is received in the bottom cover 11.

The light emitting device packages 101 are arrayed on the module substrate 12. In detail, the light emitting device packages 101 are solder-bonded to the module substrate 12. A circuit pattern is formed on the module substrate 12 and the ceramic substrate 110 is mounted on the module substrate 12 such that the light emitting device packages 101 can be selectively connected to each other.

The light emitting device package 101 outputs the light emitted from the light emitting device as well as the light emitted from the phosphor material of the phosphor layer. The lights are mixed with each other into a target light and the target light is irradiated through the optical member 15 and the display panel 16.

The optical member 15 may include at least one of a light guide plate, a diffusion sheet, a horizontal/vertical prism sheet, and a brightness enhancement film. The light guide plate may include a PC material or a PMMA (poly methyl methacrylate) material. Such a light guide plate may be omitted. The diffusion sheet diffuses the incident light, the horizontal/vertical prism sheet concentrates the incident light onto the display region, and the brightness enhancement sheet improves the brightness of light by reusing the wasted light.

The display panel 16 is disposed on the optical member 15. For instance, the display panel 16 may be an LCD panel including first and second transparent substrates and a liquid crystal layer interposed between the first and second substrates. A polarizing plate can be attached to at least one surface of the display panel 16, but the embodiment is not limited thereto. The display panel 16 displays information by using the light passing through the optical member 15.

Such a display device 10 can be applied to a portable terminal, a monitor of a notebook computer or a laptop computer, and a television.

Figure 14:
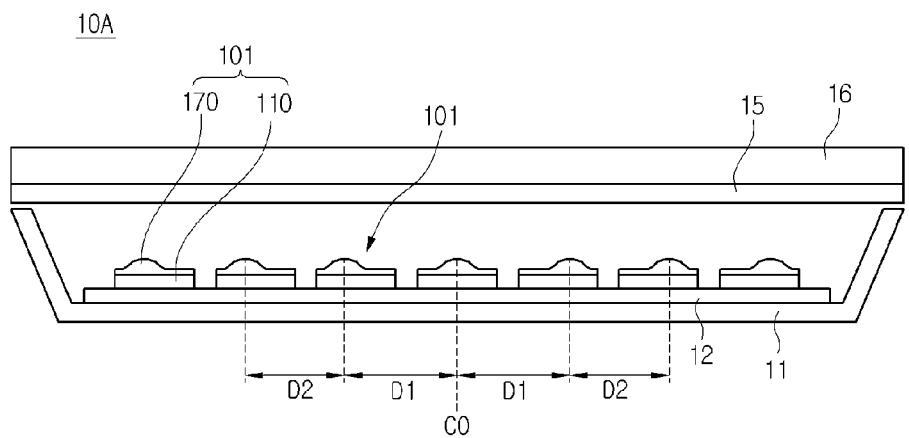
FIG. 14 is a view showing another arrangement of the light emitting device package shown in FIG. 13.

FIG. 14 is a view showing another example of the display device shown in FIG. 13, in which the arrangement of the light emitting device package is modified.

Referring to FIG. 14, the display device 10A includes a module substrate 12 and light emitting device packages 101 arrayed on the module substrate 12, which are arranged differently from the light emitting device packages 101 shown in FIG. 13.

A lens unit of the light emitting device package 101 disposed at the center region C0 is aligned in the same direction with the lens unit shown in FIG. 12, and the remaining lens units of the light emitting device packages 101 are aligned in the direction as shown in FIG. 11. Thus, the interval between the lens units of the light emitting device packages 101 may be increased at the center region C0. In detail, the interval D1 between the center lens unit and the lens unit adjacent to the center lens unit may be larger than the interval D1 between two other lens units. Thus, the embodiment can represent various light distributions using one type of package by utilizing the feature of the light emitting device and the lens unit, which are biased in one direction on the package as shown in FIGS. 11 and 12. The lens unit is formed on the light emitting device as shown in FIGS. 12 and 13.

Meanwhile, the light can be supplied to at least one lateral side of the light guide plate in the side-view scheme by vertically erecting the module substrate 12. In detail, the module substrate can be disposed corresponding to one lateral side, both lateral sides or two adjacent lateral sides of the light guide plate, but the embodiment is not limited thereto. A reflective plate is disposed below the light guide plate and the optical sheet is disposed above the light guide plate, but the embodiment is not limited thereto.

Figure 15:
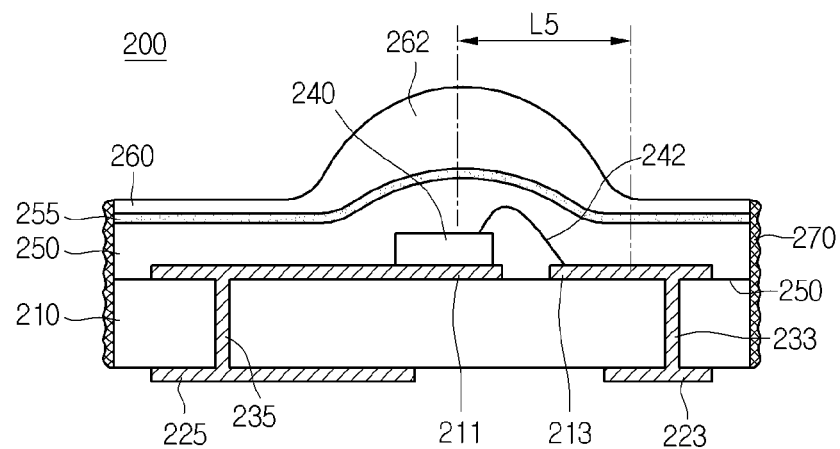
FIG. 15 is a side sectional view showing a light emitting device package according to the seventh embodiment.

Hereinafter, the embodiment will be described with reference to accompanying drawings. FIG. 15 is a side sectional view of the light emitting device package, FIG. 16 is a plan view showing a pattern formed on a top surface of the ceramic substrate shown in FIG. 15, and FIG. 17 is a bottom view of the ceramic substrate shown in FIG. 15.

Figure 16:
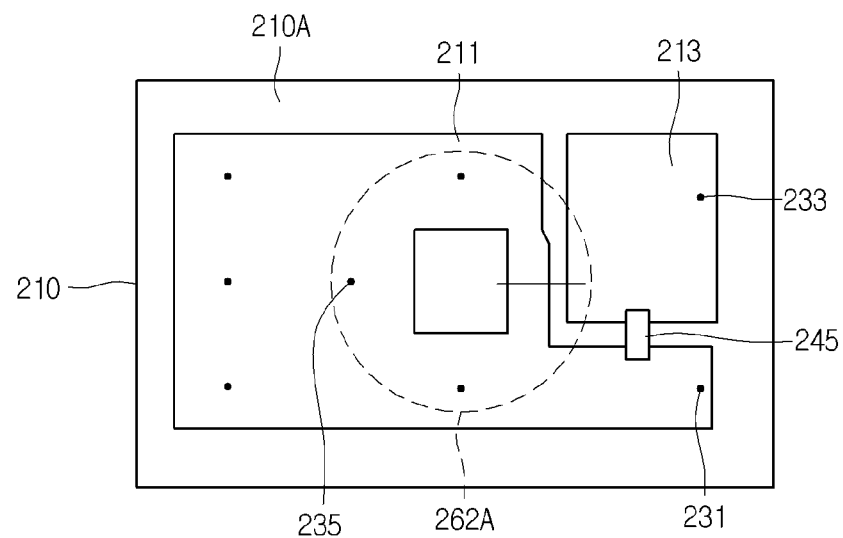
FIG. 16 is a plan view showing a top surface pattern of a ceramic substrate shown in FIG. 15.
Figure 17:
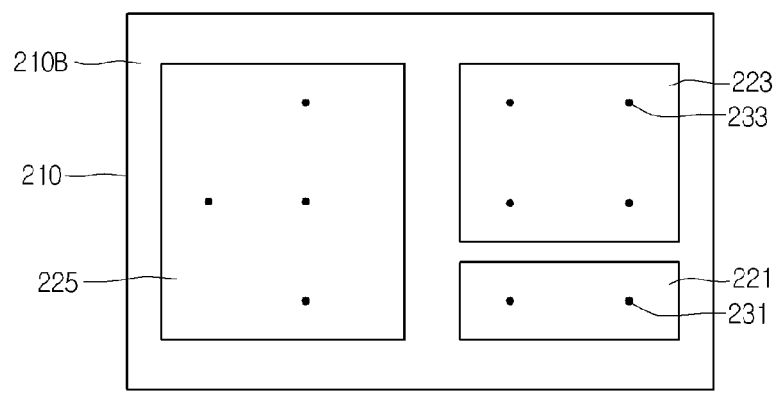
FIG. 17 is a bottom view showing a lower surface pattern of a ceramic substrate shown in FIG. 15.

Referring to FIGS. 15 to 17, the light emitting device package 200 includes a substrate 210, first and second electrode patterns 211 and 213, third and fourth electrode patterns 221 and 223, a heat radiation pattern 225, conductive vias 231, 233 and 235, a light emitting device 240, a first light-transmissive resin layer 250, a phosphor layer 255, a second light-transmissive resin layer 260, and a moisture barrier layer 270.

The substrate 210 has a superior heat-resistant property and a superior tarnish-resistant property against heat. The substrate 210 may include alumina, quartz, calcium zirconate, forsterite, SiC, graphite, fused silica, mullite, cordierite, zirconia, beryllia, aluminum nitride, or LTCC (low temperature co-fired ceramic). For the purpose of convenience of explanation, the planar type ceramic substrate will be described below as an example of the substrate 210.

The ceramic substrate 210 may be prepared as a single-layer substrate or a multiple-layer substrate by using the structure of a single-side copper foil layer or a dual-side copper foil layer. The copper foil layer may be prepared as a metal plate by selectively using a conductive metal, such as Cu, Ag, Al, Ni, or Au and may have a predetermined pattern formed through an etching process. The ceramic substrate 210 may have a circular shape or a polygonal shape, but the embodiment is not limited thereto.

Referring to FIGS. 16 and 17, the first and second electrode patterns 211 and 213 are formed on a top surface 210A of the ceramic substrate 210, and the third and fourth electrode patterns 221 and 223 and the heat radiation pattern 225 are formed on a lower surface 210B of the ceramic substrate 210. The first electrode pattern 211 is connected to the third electrode pattern 221 through at least one conductive via 231 such that a part of the first electrode pattern 211 may correspond to a part of the third electrode pattern 221. In addition, the second electrode pattern 213 is connected to the fourth electrode pattern 223 through at least one conductive via 233 such that a part of the second electrode pattern 213 may correspond to a part of the fourth electrode pattern 223.

A size of the first electrode pattern 211 may be larger than that of the second electrode pattern 213 and the first electrode pattern 211 may branch in various directions to dissipate heat generated from the light emitting device 240.

The heat radiation pattern 225 may be formed on the lower surface 210B of the ceramic substrate 210 corresponding to the first electrode pattern 211. The first electrode pattern 211 is connected to the heat radiation pattern 225 through at least one third conductive via 235 such that a part of the first electrode pattern 211 may correspond to a part of the heat radiation pattern 225. The heat radiation pattern 225 may have a size larger than that of the third and fourth electrode patterns 221 and 223.

The light emitting device 240 is formed on the first electrode pattern 211. In detail, the light emitting device 240 is mounted on the first electrode pattern 211 by using a conductive adhesive or a die bonding.

The second electrode pattern 213 is spaced apart from the first electrode pattern 211 and connected to the light emitting device 240 through a wire 242.

The first and second electrode patterns 211 and 213 are positioned corresponding to the center region of the ceramic substrate 210 and electrically connected to the light emitting device 240. A part of the first electrode pattern 211 may correspond to a part of the second electrode pattern 213 at the other region and a protective device, such as the Zener diode or the TVS (transient voltage suppression), may be electrically connected to the first and second electrode patterns 211 and 213.

The light emitting device 240 can be connected to the first and second electrode patterns 211 and 213 through a die bonding scheme, a flip chip bonding scheme or a wire bonding scheme according to the position of an electrode of a chip or a type of the chip.

As shown in FIGS. 15 to 17, the first to third conductive vias 231, 233 and 235 are formed through the ceramic substrate 210 such that the patterns formed on the ceramic substrate 210 can be connected to the patterns formed under the ceramic substrate 210. The first to third conductive vias 231, 233 and 235 of the ceramic substrate 210 can be formed by filling via holes or through holes with conductive materials, such as Ag, or coating the conductive materials around the via holes or through holes. The third electrode pattern 221 can be integrally formed with the heat radiation pattern 225. Such a configuration of the patterns may vary depending on the heat radiation efficiency.

The light emitting device 240 is an LED chip including a color LED chip, such as blue LED chip, a green LED chip, or a red LED chip, or a UV LED chip. At least one light emitting device 240 may be disposed on the ceramic substrate 210.

Referring to FIG. 15, a resin layer may be formed on the ceramic substrate 210. The resin layer is an encapsulant layer to cover the light emitting device 240 and may include a phosphor material. For instance, the resin layer may include the first light-transmissive resin layer 250, the phosphor layer 255 and the second light-transmissive resin layer 260.

The first light-transmissive resin layer 250 is formed on the ceramic substrate 210, and the phosphor layer 255 is formed on the first light-transmissive resin layer 250. The second light-transmissive resin layer 260 is formed on the phosphor layer 255. The first light-transmissive resin layer 250, the phosphor layer 255 and the second light-transmissive resin layer 260 may include a resin material, such as silicon, epoxy, or hybrid resin, but the embodiment is not limited thereto.

The first light-transmissive resin layer 250 encapsulants the light emitting device 240 and the first and second electrode patterns 211 and 213. The first light-transmissive resin layer 250 may have a predetermined thickness larger than a thickness of the light emitting device 240. The first light-transmissive resin layer 250 may be uniformly formed on the ceramic substrate 210 or may be unevenly formed on the ceramic substrate 210 according to the configuration of the structure.

The phosphor layer 255 may be formed on the first light-transmissive resin layer 250 through a molding process or a coating process. The phosphor layer 255 may include at least one type of phosphor materials, but the embodiment is not limited thereto. The phosphor layer 255 can be formed over the whole area of the first light-transmissive resin layer 250 with a predetermined thickness.

The second light-transmissive resin layer 260 may be formed on the phosphor layer 255. For instance, the second light-transmissive resin layer 260 can be formed through the injection molding process. The second light-transmissive resin layer 260 includes a lens unit 262. The lens unit 262 has a convex lens shape and protrudes upward of the light emitting device 240. The lens unit may be omitted.

Other regions of the second light-transmissive resin layer 260 except for the lens unit 262 are flat, so the second light-transmissive resin layer 260 can be formed on the phosphor layer 255 with a uniform thickness.

Referring to FIGS. 15 and 16, the distance L5 between the center and the outer portion of the lens unit 262 corresponds to the radius of a lower circle 262A and has a size of about 600 μm or more. The distance L5 may vary depending on the chip size. An area of the electrode patterns 211 and 213 in the lower circle 262A may be 70% or above, so the light reflection efficiency can be improved.

The moisture barrier layer 270 is formed at an outer portion of the ceramic substrate 210 by using spray equipment or sputtering equipment.

The moisture barrier layer 270 prevents the moisture from penetrating into the interfacial surfaces between the ceramic substrate 210 and the resin layers 250, 255 and 260.

The moisture barrier layer 270 may be formed on at least one side or the entire surface of the ceramic substrate 210 and outer portions of the resin layers 250, 255 and 260.

The moisture barrier layer 270 may include a same material with a material of the resin layers 250, 255 and 260 or the ceramic substrate 210. For instance, the moisture barrier layer 270 may include one selected from the group consisting of silicon, epoxy, sapphire, and nitride aluminum. In this case, the adhesive strength between the moisture barrier layer 270 and the resin layers 250, 255 and 260 or between the moisture barrier layer 270 and the ceramic substrate 210 may be reinforced and the thermal deformation can be reduced.

The moisture barrier layer 270 can be formed along an outer contour profile of the ceramic substrate 210 and the resin layers 250, 255 and 260. For instance, the moisture barrier layer 270 may have an irregular concavo-convex shape. In this case, the adhesive strength may be increased at the contact surface between the moisture barrier layer 270 and the resin layers 250, 255 and 260 or between the moisture barrier layer 270 and the ceramic substrate 210 and the travelling direction of the light can be changed at the outside of the resin layers 250, 255 and 260.

FIGS. 18 to 21 are sectional views showing the procedure for manufacturing the light emitting device package.

Figure 18:
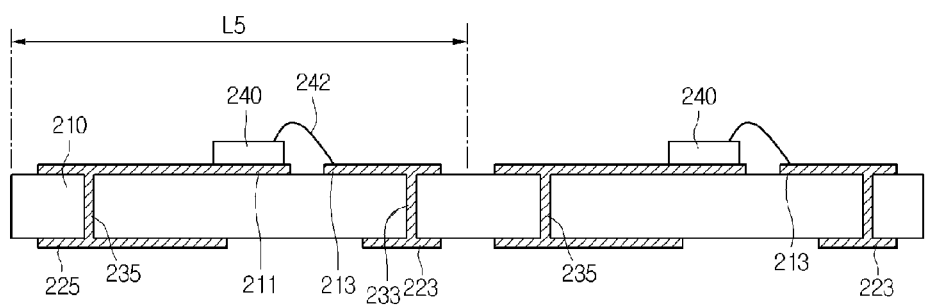
FIGS. 18 to 21 are sectional views showing the procedure for manufacturing a light emitting device package according to the seventh embodiment.

Referring to FIG. 18, the first and second electrode patterns 211 and 213 are formed on the ceramic substrate 210 and the third and fourth electrode patterns 221 and 223 and the heat radiation pattern 225 are formed under the ceramic substrate 210. As shown in FIGS. 16 and 17, the first electrode pattern 211 is connected to the third electrode pattern 221 (see, FIG. 17) and the heat radiation pattern 225 through the first and third conductive vias 231 and 235, respectively, and the second electrode pattern 213 is connected to the fourth electrode pattern 223 through the second conductive via 233.

The light emitting device 240 is disposed on the first electrode pattern 211. The light emitting device 240 is electrically connected to the first electrode pattern 211 through the die bonding scheme, and connected to the second electrode pattern 213 through a wire. The light emitting device 240 can be electrically connected to the first and second electrode patterns 211 and 213 through one wire, plural wires, a flip bonding scheme or the die bonding scheme according to the type of the chip or the mounting scheme for the light emitting device 240. The light emitting device 240 is an LED chip including a color LED chip, such as blue LED chip, a green LED chip, or a red LED chip, or a UV LED chip, but the embodiment is not limited thereto.

One or plural light emitting devices 240 can be installed in each package unit (2P) and a plurality of LED chips are connected to each other in series or parallel.

The light emitting device 240 is disposed on the first electrode pattern 211 formed on the top surface of the ceramic substrate 210, so the first electrode pattern 211 may have a relatively large area to effectively reflect the light and dissipate the heat. In addition, a photo solder resistor (PSR) is coated on the top surface of the ceramic substrate 210 except for the region of the first and second electrode patterns 211 and 213 to improve the reflectivity of the light.

Figure 19:
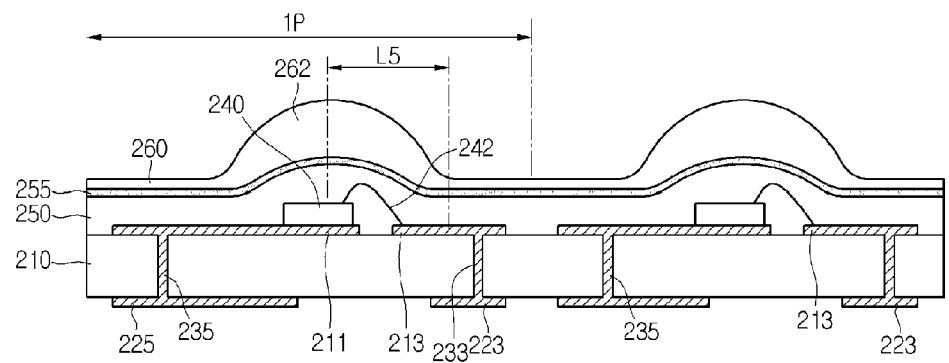

Referring to FIGS. 18 and 19, the resin layers 250, 255 and 260 may be formed on the ceramic substrate 210 and the resin layers 250, 255 and 260 may include phosphor materials. According to the embodiment, the first light-transmissive resin layer 250, the phosphor layer 255 and the second light-transmissive resin layer 260 are formed on the ceramic substrate 210 and the resin layers 250, 255 and 260 may include a resin material, such as silicon, epoxy, or hybrid resin, but the embodiment is not limited thereto.

The first light-transmissive resin layer 250, the phosphor layer 255 and the second light-transmissive resin layer 260 may have the same refractive index. Otherwise, the first light-transmissive resin layer 250, the phosphor layer 255 and the second light-transmissive resin layer 260 may include materials having refractive indexes which are gradually lowered. The materials for the resin layers 250, 255 and 260 have the refractive index in the range of 1 to 2.

The first light-transmissive resin layer 250 may have the uniform thickness or the variable thickness depending on the regions thereof. The first light-transmissive resin layer 250 may have the injection-molded structure and may have an irregular shape due to the structural shape of the top surface of the ceramic substrate 210. The wire connected to the light emitting device 240 is disposed below the first light-transmissive resin layer 250 and a part of the wire may be disposed on the first light-transmissive resin layer 250, but the embodiment is not limited thereto.

The phosphor layer 255 can be prepared by adding a phosphor material to a resin material and coated on the first light-transmissive resin layer 250 with a uniform thickness, but the embodiment is not limited thereto. The phosphor layer 255 can be formed over the whole top surface of the first light-transmissive resin layer 250.

The phosphor material added to the phosphor layer 255 may include at least one of the blue phosphor material, the green phosphor material, the yellow phosphor material and the red phosphor material, but the embodiment is not limited thereto.

The second light-transmissive resin layer 260 can be formed on the phosphor layer 255 through the injection molding process. The second light-transmissive resin layer 260 includes the lens unit 262 formed on the light emitting device 240. The lens unit 262 includes a convex lens formed on the light emitting device 240.

The distance L5 between the center and the outer portion of the lens unit 262 corresponds to the radius of a largest circle in the lens unit 262 and has a size of about 600 μm or more.

The second light-transmissive resin layer 260 is disposed on the phosphor layer 255. Other regions of the second light-transmissive resin layer 260 except for the lens unit 262 may have a planar shape or a concavo-convex shape.

Figure 20:
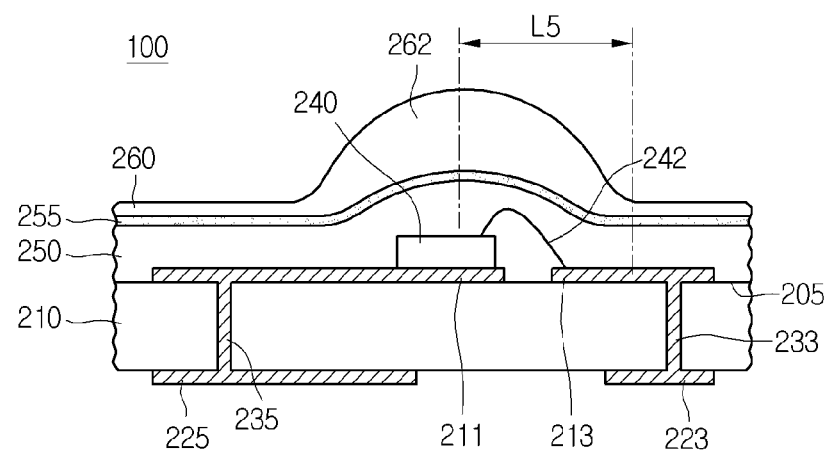

Referring to FIGS. 19 and 20, when the second light-transmissive resin layer 260 has been formed, the ceramic substrate 210 is divided into a package unit. For instance, the dicing process using a blade can be employed to divide the ceramic substrate 210 into the package unit. In addition, the ceramic substrate 210 can be divided into the package unit through the breaking process, in which a groove (for instance, a V-groove) is formed in a package boundary of the ceramic substrate 210 to divide the ceramic substrate 210. As a result, the light emitting device package shown in FIG. 20 can be obtained. The ceramic substrate 210 may have a circular shape or a polygonal shape, but the embodiment is not limited thereto.

A gap may be formed between the ceramic substrate 210 and the resin layers. In detail, the gap may be formed at an interfacial surface 205 between the ceramic substrate 210 and the first light-transmissive resin layer 250 due to the above dicing process or the breaking process and moisture may penetrate into the gap. The moisture may oxidize the electrode patterns 211 and 213 and cause electric short between the electrode patterns 211 and 213, thereby shortening the life span of the light emitting device 240.

Figure 21:
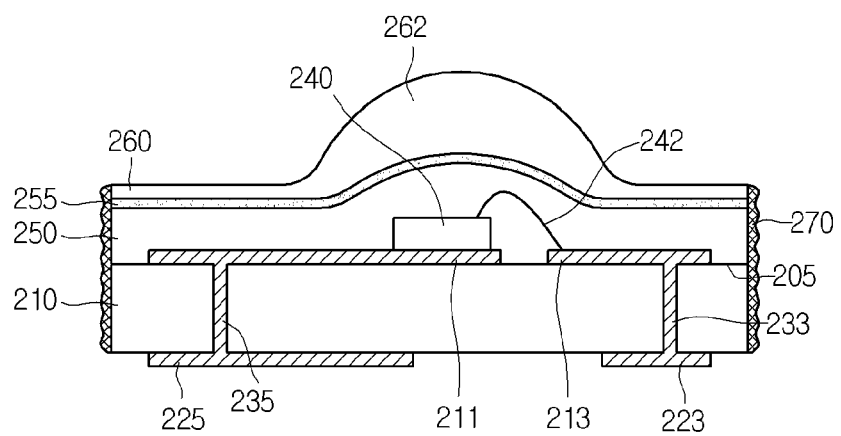

Referring to FIGS. 20 and 21, the moisture barrier layer 270 is formed at an outer portion of the ceramic substrate 210. The moisture barrier layer 270 may include silicon, epoxy, alumina, or nitride alumina. In order to improve the adhesive strength with respect to the resin layers 250, 255 and 260 or the ceramic substrate 210, the moisture barrier layer 270 may include the material the same as that of the resin layers 250, 255 and 260 or the ceramic substrate 210.

The moisture barrier layer 270 may be formed on at least one side or the entire surface of the ceramic substrate 210 and outer portions of the resin layers 250, 255 and 260. The embodiment does not limit the thickness of the moisture barrier layer 270.

The moisture barrier layer 270 can be formed along an outer contour profile of the ceramic substrate 210 and the resin layers. For instance, the moisture barrier layer 270 may have an irregular concavo-convex shape.

The light emitting device package can emit the light having a color, such as white, red, green or blue. In addition, the light emitting device package including the ceramic substrate 210 may represent the superior property against the moisture.

Figure 22:
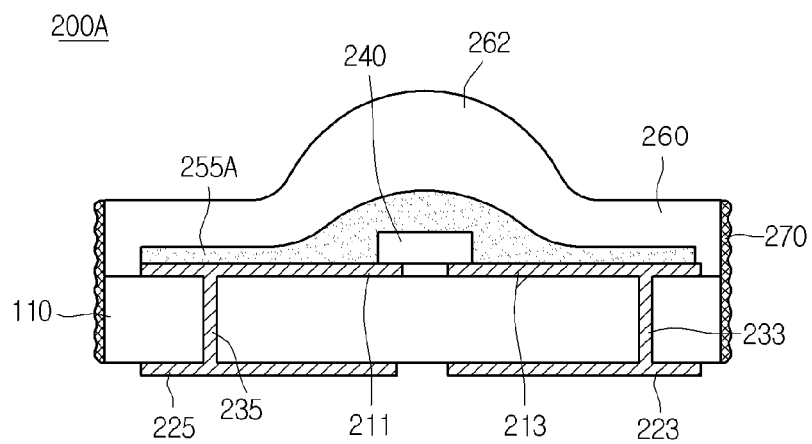
FIG. 22 is a side sectional view showing a light emitting device package according to the eighth embodiment.

FIG. 22 is a side sectional view showing a light emitting device package according to the eighth embodiment. The following description of the eighth embodiment will be made with reference to the seventh embodiment.

Referring to FIG. 22, the light emitting device package 200A is bonded to the first and second electrode patterns 211 and 213 of the ceramic substrate 210 through the flip scheme. The protective device, such as a Zener diode or the TVS (transient voltage suppression) diode, may be bonded to the first and second electrode patterns 211 and 213 through the flip scheme.

A phosphor layer 255A is formed on the ceramic substrate 210. The phosphor layer 255A may be formed on the light emitting device 240 or on the region covering the first and second electrode patterns 211 and 213. In addition, phosphor layer 255A can be formed at an outer portion of the ceramic substrate 210 such that the phosphor layer 255A may not be exposed.

The second light-transmissive resin layer 260 is formed on the phosphor layer 255A. The second light-transmissive resin layer 260 includes the lens unit 262 protruding upward of the light emitting device 240. The second light-transmissive resin layer 260 makes contact with the phosphor layer 255A and an outer portion of the top surface of the ceramic substrate 210 to surround the whole surface of the phosphor layer 255A.

The moisture barrier layer 270 is formed between the ceramic substrate 210 and the outer surface of the second light-transmissive resin layer 260. In detail, the moisture barrier layer 270 is formed at the interfacial surface between the ceramic substrate 210 and the second light-transmissive resin layer 260. Thus, the moisture is prevented from penetrating into the gap between the ceramic substrate 210 and the second light-transmissive resin layer 260.

Figure 23:
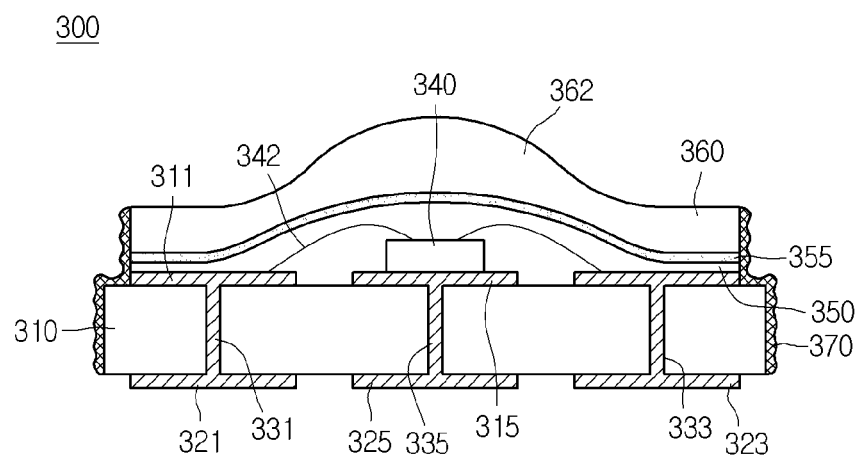
FIG. 23 is a side sectional view showing a light emitting device package according to the ninth embodiment.

FIG. 23 is a side sectional view showing a light emitting device package according to the ninth embodiment. The following description of the ninth embodiment will be made with reference to the seventh embodiment.

Referring to FIG. 23, the first electrode pattern 311, the second electrode pattern 313 and the first heat radiation pattern 315 are formed on the top surface of the ceramic substrate 310, and the third electrode pattern 321, the fourth electrode pattern 323 and the second heat radiation pattern 325 are formed on the lower surface of the ceramic substrate 310. A plurality of conductive vias 331, 333 and 335 are formed in the ceramic substrate 310.

The first heat radiation pattern 315 is disposed between the first electrode pattern 311 and the second electrode pattern 313 and the second heat radiation pattern 325 is disposed between the third electrode pattern 321 and the fourth electrode pattern 323.

The light emitting device 340 is attached onto the first heat radiation pattern 315 and the light emitting device 340 is connected to the first and second electrode patterns 311 and 313 through the wire 342.

The first electrode pattern 311 is opposite to the third electrode pattern 321 and connected to the third electrode pattern 321 through the first conductive via 331. The second electrode pattern 313 is opposite to the fourth electrode pattern 323 and connected to the fourth electrode pattern 323 through the second conductive via 333. The first heat radiation pattern 315 is connected to the second heat radiation pattern 325 through the third conductive via 335. A plurality of first to third conductive vias 331, 333 and 335 are provided to improve the conductive efficiency, but the embodiment is not limited thereto.

Heat generated from the light emitting device 340 is transferred to the first and second heat radiation patterns 315 and 325 through the third conductive via 335 and then dissipated to the outside.

The first light-transmissive resin layer 350, the phosphor layer 355 and the second light-transmissive resin layer 360 are formed on the ceramic substrate 310. In detail, the resin layers 350, 355 and 360 are formed on an inner portion of the top surface of the ceramic substrate 310. An outer portion of the top surface of the ceramic substrate 310 is exposed because there are no resin layers 350, 355 and 360. Thus, the moisture barrier layer 370 is formed at an outer portion of the ceramic substrate 310, the outer portion of the top surface of the ceramic substrate 310, and an outer portion of the resin layers 350, 355 and 360. The moisture barrier layer 370 is formed along the contour profile of the light emitting device package 300. For instance, the moisture barrier layer 370 may have the stepped structure. Since the moisture barrier layer 370 is formed at the outer portion of the ceramic substrate 310, a contact area between the moisture barrier layer 370 and the top surface of the ceramic substrate 310 may be enlarged, so that the moisture is prevented from penetrating into the gap between the ceramic substrate 310 and the resin layers. The moisture barrier layer 370 is formed of a same material that of the resin layer 350, 355 and 360 or the ceramic substrate 310 and the resin layer 350, 355 and 360 has a width equal to or less that of the ceramic substrate 310.

The light emitting device package according to the embodiments can be used as the light source for the indicator, the lighting device and the display device. In addition, one embodiment may be selectively applicable to other embodiments. The light emitting device package according to the embodiments can be used for the light unit having the structure provided with a plurality of light emitting device packages. The light unit may be applicable to a lighting lamp, a signal lamp, a headlight of a vehicle, and an electric signboard.

Figure 24:
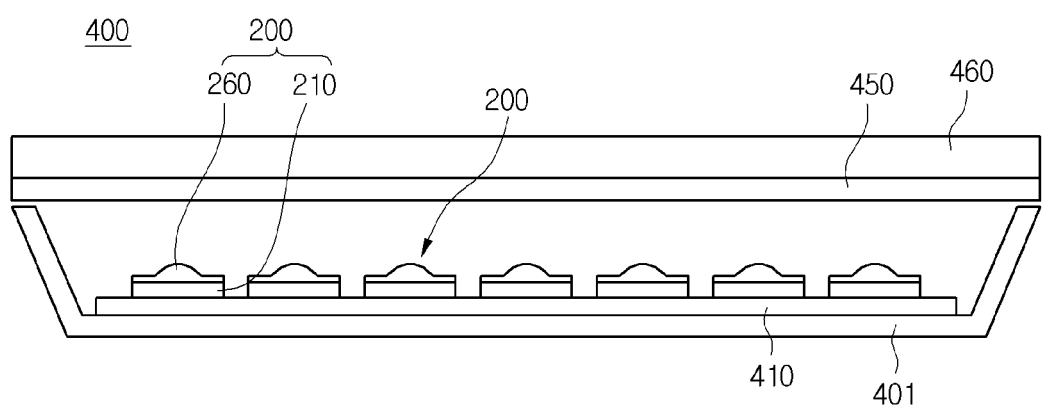
FIG. 24 is a view showing a display device including a light emitting device package according to the embodiment.

FIG. 24 is a view showing a display device according to the embodiment. The package shown in FIG. 24 is same with the package described above.

Referring to FIG. 24, the display device 400 includes a bottom cover 401, a module substrate 410 on which a plurality of light emitting device packages 200 are arrayed, an optical member 50 and a display panel 460.

The module substrate 410 and the light emitting device packages 200 may constitute a light emitting module and the bottom cover 401, at least one light emitting module and the optical member 450 may constitute a light unit.

The light emitting device packages 200 are arrayed on the module substrate 410 such that lens units of the resin layers 260 are spaced apart from each other at a regular interval, so that the light can be emitted over the whole area with a uniform brightness distribution. That is, the light emitting device packages 200 as shown in FIG. 15 are arrayed on the module substrate 410.

The bottom cover 401 includes a same material with a material of a chassis or a mold frame, and the module substrate 410 is received in the bottom cover 401.

The light emitting device packages 200 are arrayed on the module substrate 410. In detail, the light emitting device packages 200 are solder-bonded to the module substrate 410. A circuit pattern is formed on the module substrate 410 and the ceramic substrate 210 is mounted on the module substrate 410 such that the light emitting device packages 200 can be selectively connected to each other.

The light emitting device package 200 outputs the light emitted from the light emitting device as well as the light emitted from the phosphor material of the phosphor layer. The lights are mixed with each other into a target light and the target light is irradiated through the optical member 450 and the display panel 460.

The optical member 450 may include at least one of a light guide plate, a diffusion sheet, a horizontal/vertical prism sheet, and a brightness enhancement film. The light guide plate may include a PC material or a PMMA (poly methyl methacrylate) material. Such a light guide plate may be omitted. The diffusion sheet diffuses the incident light, the horizontal/vertical prism sheet concentrates the incident light onto the display region, and the brightness enhancement sheet improves the brightness of light by reusing the wasted light.

The display panel 460 is disposed on the optical member 450. For instance, the display panel 460 may be an LCD panel including first and second transparent substrates and a liquid crystal layer interposed between the first and second substrates. A polarizing plate can be attached to at least one surface of the display panel 460, but the embodiment is not limited thereto. The display panel 460 displays information by using the light passing through the optical member 450.

Such a display device 400 can be applied to a portable terminal, a monitor of a notebook computer or a laptop computer, and a television.

A method of manufacturing a light emitting device package according to the embodiment includes the steps of mounting a light emitting device on a ceramic substrate; forming a resin layer on the ceramic substrate to seal the light emitting device; dividing the ceramic substrate into package units; and forming a moisture barrier layer at an interfacial surface between the divided ceramic substrate and the resin layer.

The embodiment can prevent moisture from penetrating into the package employing the ceramic substrate. The embodiment can provide the light emitting device package capable of effectively dissipating heat generated from the light emitting device. The embodiment can improve the reliability of the light emitting device package. The embodiment can provide the light emitting device package employing a planar type ceramic substrate. The embodiment can improve the light distribution by disposing the light-transmissive resin layer between the phosphor layer and the light emitting device such that the phosphor layer can be spaced apart from the light emitting device. The embodiment can effectively dissipate heat generated from the light emitting device by using the ceramic substrate.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a ceramic substrate;
a semiconductor light emitting device disposed on a top surface of the ceramic substrate;
a first light-transmissive resin layer disposed on the top surface of the ceramic substrate and a top surface of the semiconductor light emitting device to cover the semiconductor light emitting device;
a second light-transmissive resin layer disposed on a top surface of the first light-transmissive resin layer; and
a phosphor layer including a phosphor material between the top surface of the first light-transmissive resin layer and a lower surface of the second light-transmissive resin layer,
wherein the first light-transmissive resin layer has a same width as a width of the ceramic substrate,
wherein the first and second light-transmissive resin layers include a convex portion protruding upward of the semiconductor light emitting device,
wherein the first light-transmissive resin layer physically contacts a surface of the semiconductor light emitting device,
wherein the lower surface of the second light-transmissive resin layer physically contacts a top surface of the phosphor layer,
wherein the first light-transmissive resin layer includes a planar top surface substantially parallel to the top surface of the ceramic substrate on a periphery of the convex portion of the first light-transmissive resin layer,
wherein the second light-transmissive resin layer includes a planar top surface substantially parallel to the top surface of the ceramic substrate on a periphery of the convex portion of the second light-transmissive resin layer, wherein a lower surface of the phosphor layer is spaced apart from the top surface of the ceramic substrate, and
wherein the first and second light-transmissive resin layers do not contain any phosphor material.

2. The light emitting device package of claim 1, further comprising:
first and second electrode patterns electrically connected to the semiconductor light emitting device and disposed on the ceramic substrate;
third and fourth electrode patterns under the ceramic substrate; and
a plurality of first and second conductive vias to connect the first and second electrode patterns with the third and fourth electrode patterns according to polarity of the first to fourth electrode patterns.

3. The light emitting device package of claim 2, further comprising:
a heat radiation pattern disposed under a lower surface of the ceramic substrate and physically contacting the lower surface of the ceramic substrate; and
a third conductive via physically contacting the heat radiation pattern and the first electrode pattern.

4. The light emitting device package of claim 3, wherein the semiconductor light emitting device is disposed on the first electrode pattern and physically contacts the heat radiation pattern.

5. The light emitting device package of claim 2, further comprising:
a first heat radiation pattern on the substrate and spaced apart from the first and second electrode patterns;
a second heat radiation pattern under a lower surface of the substrate; and
a fourth conductive via physically contacting the first and second heat radiation patterns,
wherein the semiconductor light emitting device is disposed on the first heat radiation pattern.

6. The light emitting device package of claim 1, wherein the planar top surface of the first light-transmissive resin layer overlaps the lower surface of the phosphor layer in a vertical direction.

7. A light emitting device package comprising:
a substrate;
a semiconductor light emitting device on the substrate;
a plurality of resin layers disposed on a top surface of the substrate and the semiconductor light emitting device; and
a moisture barrier layer physically contacting a vertical sidewall of the substrate and a sidewall of the plurality of resin layers,
wherein the plurality of resin layers overlaps the semiconductor light emitting device,
wherein the moisture barrier layer is directly disposed on a boundary between the sidewall of the substrate and at least one of the plurality of resin layers adjacent to the substrate, and
wherein a portion of the moisture barrier layer is located at a lower position than the top surface of the substrate and does not overlap the substrate in a vertical direction.

8. The light emitting device package of claim 7, wherein the moisture barrier layer is formed of a same material as a material of the plurality of resin layers or the substrate.

9. The light emitting device package of claim 7, wherein the plurality of resin layers has a width equal to or less than a width of the substrate and sidewalls of the substrate are disposed at an outer portion than that of the plurality of resin layers, and
wherein the moisture barrier layer physically contacts the top surface of the substrate.

10. The light emitting device package of claim 7, further comprising:
first and second electrode patterns electrically connected to the semiconductor light emitting device and disposed on the substrate;
third and fourth electrode patterns under the substrate; and
a plurality of first and second conductive vias to connect the first and second electrode patterns with the third and fourth electrode patterns according to polarity of the first to fourth electrode patterns;
a heat radiation pattern under a lower surface of the substrate; and
a third conductive via physically contacting the heat radiation pattern and the first electrode pattern.

11. The light emitting device package of claim 10, wherein the substrate is a ceramic substrate and the semiconductor light emitting device is formed on the first electrode pattern physically contacting the heat radiation pattern.

12. The light emitting device package of claim 11, wherein the substrate has a planar top surface, and
wherein at least one of the plurality of resin layers includes a planar top surface on a periphery region adjacent the sidewall of the substrate.

13. The light emitting device package of claim 7, wherein the moisture barrier layer is disposed on a whole sidewall of one of the plurality of resin layers.

14. The light emitting device package of claim 7, wherein the moisture barrier layer includes at least one of alumina, aluminum nitride, silicon, epoxy and hybrid resin.

15. The light emitting device package of claim 7, wherein the plurality of resin layers includes:
a first light-transmissive layer disposed on the top surface of the substrate;
a phosphor layer disposed on a top surface the first light-transmissive resin layer; and
a second light-transmissive resin layer having a lens unit disposed on a top surface of the phosphor layer, and
wherein the phosphor layer physically contacts the first light-transmissive resin layer and the second light-transmissive resin layer.

16. The light emitting device package of claim 15, wherein the first light-transmissive resin layer, the phosphor layer, and the second light-transmissive resin layer each have a width equal to or larger than a width of the substrate.

17. The light emitting device package of claim 15, wherein the first and second light-transmissive resin layers include a convex portion protruding upward of the semiconductor light emitting device, and
wherein the first light-transmissive resin layer includes a planar top surface substantially parallel to the top surface of the ceramic substrate on a periphery of the convex portion.

18. The light emitting device package of claim 15, wherein the first and second light-transmissive resin layers do not contain any phosphor material.

19. The light emitting device package of claim 18, wherein the phosphor layer is spaced apart from the top surface of the substrate.

20. The light emitting device package of claim 7, wherein the moisture barrier layer directly contacts a boundary between lateral surfaces of the plurality of resin layers.

* * * * *